United States Patent
Suga

(10) Patent No.: US 6,940,317 B2
(45) Date of Patent: Sep. 6, 2005

(54) LEVEL-SHIFTER CIRCUIT PROPERLY OPERABLE WITH LOW VOLTAGE INPUT

(75) Inventor: Masato Suga, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/342,172

(22) Filed: Jan. 15, 2003

(65) Prior Publication Data

US 2003/0174007 A1 Sep. 18, 2003

(30) Foreign Application Priority Data

Mar. 13, 2002 (JP) .................................. 2002-069067

(51) Int. Cl.[7] ................................................ H03K 5/22
(52) U.S. Cl. ............................. 327/65; 327/89; 327/534
(58) Field of Search ................................ 327/65–67, 89, 327/52–57, 534; 326/80, 81

(56) References Cited

U.S. PATENT DOCUMENTS 6,252,429 B1 * 6/2001 Assaderaghi et al. .......... 327/55

FOREIGN PATENT DOCUMENTS

| JP | 4-70007 | 3/1992 |
|---|---|---|
| JP | 6-37624 | 2/1994 |
| JP | 10-11989 | 1/1998 |

* cited by examiner

Primary Examiner—Kenneth B. Wells
(74) Attorney, Agent, or Firm—Arent Fox PLLC

(57) ABSTRACT

A semiconductor integrated circuit includes first and second field-effect transistors which have on/off states thereof being controlled by an incoming signal varying within a first potential range, third and fourth field-effect transistors which are controlled by the on/off states of the first and second filed-effect transistors, a node from which an output signal varying within a second potential range is output according to the on/off states of the first through fourth field-effect transistors, and a control circuit which controls a substrate-bias potential of the first field-effect transistor in response to the incoming signal.

14 Claims, 9 Drawing Sheets

ADDITIONAL TRANSISTOR

--- RELATED ART
— INVENTION

LEVEL-SHIFTER CIRCUIT PROPERLY OPERABLE WITH LOW VOLTAGE INPUT

CROSS-REFERENCE TO RELATED APPLICATIONS

This application is based upon and claims the benefit of priority from the prior Japanese Patent Application No. 2002-069067 filed on Mar. 13, 2002, with the Japanese Patent Office, the entire contents of which are hereby incorporated by reference.

BACKGROUND OF THE INVENTION

1. Field of the Invention

The present invention generally relates to semiconductor integrated circuits functioning as level-shifter circuits, and particularly relates to a semiconductor integrated circuit functioning as a level-shifter circuit that operates stably at high speed even with a low voltage input.

2. Description of the Related Art

Level-shifter circuits are used for the purpose of converting a signal having a predetermined voltage to a signal having a higher voltage level. A typical level-shifter circuit is disclosed in Japanese Patent Laid-open Application No. 6-37624, for example.

FIG. 1 is a circuit diagram showing a typical construction of a level-shifter circuit.

The level-shifter circuit of FIG. 1 includes PMOS transistors 11 and 12, NMOS transistors 13 and 14, and an inverter 15. An incoming signal IN is applied to the gate of the NMOS transistor 14, and is also inverted by the inverter 15 to be applied to the gate of the NMOS transistor 13. The incoming signal IN being HIGH ($V_L$) makes the NMOS transistors 13 and 14 nonconductive and conductive, respectively, resulting in the PMOS transistors 11 and 12 being conductive and nonconductive, respectively. Accordingly, an output signal OUT is set to 0 V. If the incoming signal IN is LOW (0 V), the NMOS transistors 13 and 14 are conductive and nonconductive, respectively, resulting in the PMOS transistors 11 and 12 being nonconductive and conductive, respectively. In this case, therefore, the output signal OUT is set at $V_H$. In this manner, the incoming potential level ranging between 0 and $V_L$ is shifted to a range between 0 and $V_H$.

The transistors 11 through 14 that control the output signal OUT are designed for high-potential operations so as to properly operate at a potential range between 0 and $V_H$. In general, high-speed signal transition requires the operating range of an incoming signal IN to be set at an increasingly lower potential level as the technology improves. In such a case, since the transistors 13 and 14 are designed for high-potential operations corresponding to the potential range boosted by the level shift, the potential level $V_L$ that is relatively low may not be able to turn on or off the transistors at sufficient speed. In some cases, the transistors may fail to be sufficiently conductive.

Accordingly, there is a need for a level-shifter circuit that can stably operate at high speed even when the incoming signal is set at a potential level significantly lower that the operating potential range of the circuit-component transistors.

SUMMARY OF THE INVENTION

It is a general object of the present invention to provide a level-shifter circuit that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a level-shifter circuit particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a semiconductor integrated circuit, including first and second field-effect transistors which have on/off states thereof being controlled by an incoming signal varying within a first potential range, third and fourth field-effect transistors which are controlled by the on/off states of the first and second filed-effect transistors, a node from which an output signal varying within a second potential range is output according to the on/off states of the first through fourth field-effect transistors, and a control circuit which controls a substrate-bias potential of the first field-effect transistor in response to the incoming signal.

In the semiconductor integrated circuit functioning as a level-shifter circuit as described above, the substrate-bias potential of the first field-effect transistor is controlled by the incoming signal. The substrate-bias potential is set at an elevated level to lower the threshold when the first field-effect transistor is turned on. The lowering of the threshold makes it possible to achieve a high-speed switching-on operation of the first field-effect transistor even when the signal level of the incoming signal is relatively low. This insures that the transition of the output signal is stable and high speed.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 2:
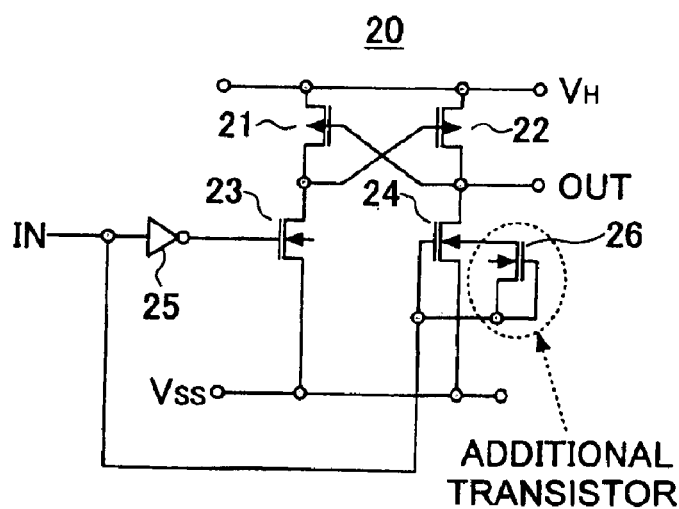
FIG. 2 is a circuit diagram showing a first embodiment of a level-shifter circuit according to the present invention.

FIG. 2 is a circuit diagram showing a first embodiment of a level-shifter circuit according to the present invention.

A level-shifter circuit 20 of FIG. 2 includes PMOS transistors 21 and 22, NMOS transistors 23 and 24, an inverter 25, and an NMOS transistor 26. An incoming signal IN is applied to the gate of the NMOS transistor 24, and is also inverted by the inverter 25 to be applied to the gate of the NMOS transistor 23. The incoming signal IN being HIGH ($V_L$) makes the NMOS transistors 23 and 24 nonconductive and conductive, respectively, resulting in the PMOS transistors 21 and 22 being conductive and nonconductive, respectively. Accordingly, an output signal OUT is set to 0 V. If the incoming signal IN is LOW (0 V), the NMOS transistors 23 and 24 are conductive and nonconductive, respectively, resulting in the PMOS transistors 21 and 22 being nonconductive and conductive, respectively. In this case, therefore, the output signal OUT is set at $V_H$. In this manner, the incoming potential level ranging between 0 and $V_L$ is shifted to a range between 0 and $V_H$.

In the circuit construction of FIG. 2, the NMOS transistor 26 is provided in the level-shifter circuit 20. The NMOS transistor 26 has a first node thereof (i.e., a drain node or a source node) coupled to the well of the NMOS transistor 24, and has a second node (i.e., a source node or a drain node) and gate node thereof coupled to the incoming signal IN.

In the level-shifter circuit 20, a potential at the gate of the NMOS transistor 26 rises from LOW to HIGH at the start of a conductive state of the NMOS transistor 24, i.e., at the negative transition of the output signal OUT responding to the transition from LOW to HIGH of the incoming signal IN. As the gate level exceeds the threshold of the NMOS transistor 26, the NMOS transistor 26 is turned on, resulting in an electric current running between the drain and the source. A potential at the first node coupled to the well of the NMOS transistor 24 is thus brought closer to the potential of the incoming signal applied to the second node. Since the second node of the NMOS transistor 26 is coupled to the gate thereof, the NMOS transistor 26 becomes nonconductive in response to the approaching of the first-node potential to the second-node potential within a predetermined range. In this manner, the first node of the NMOS transistor 26 is maintained at a predetermined potential.

The first node of the NMOS transistor 26 is coupled to the well of the NMOS transistor 24. It follows that a substrate-bias potential Vbs of the NMOS transistor 24 (i.e., the potential of the well) is set at a predetermined potential lifted off the ground potential.

When the conductive state of the NMOS transistor 24 comes to an end, i.e., when the output signal is about to rise in response to the transition from HIGH to LOW of the incoming signal IN, the NMOS transistor 26 coupled to the well of the NMOS transistor 24 is turned off while maintaining the potential at its first node. Since the well of the NMOS transistor 24 is connected to the first node of the NMOS transistor 26, the substrate-bias potential Vbs is sustained at the predetermined potential.

In this manner, the bias potential of the NMOS transistor 24 is in a floating state and always maintained at the predetermined potential. This means that the threshold is always kept at a reduced level.

Figure 1:
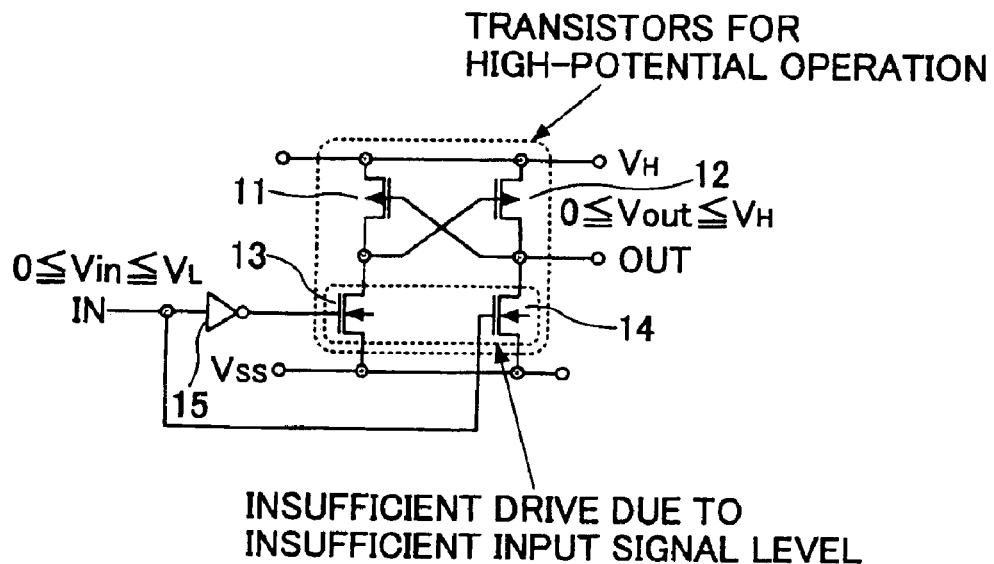
FIG. 1 is a circuit diagram showing a typical construction of a level-shifter circuit.
Figure 3:
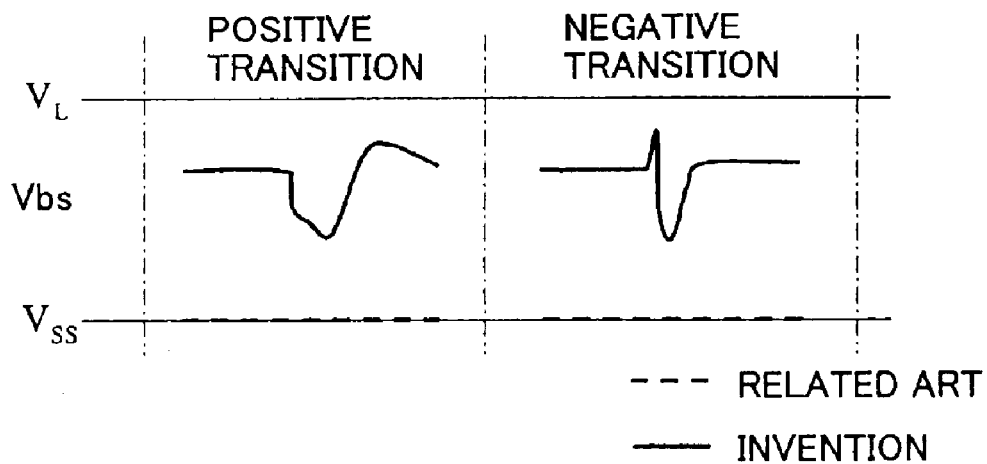
FIG. 3 is an example of a substrate-bias potential Vbs.

FIG. 3 is an example of the substrate-bias potential Vbs. At the negative transition of the output signal OUT, the substrate-bias potential Vbs does not rise to the level of the incoming-signal high potential $V_L$ because the second node is set to the same potential as the gate node. In FIG. 3, the waveform of the substrate-bias potential Vbs is illustrated for the positive transition of the output signal OUT and for the negative transition of the output signal OUT. As shown in FIG. 3, the substrate-bias potential Vbs is always maintained at a predetermined potential. Since the substrate-bias potential Vbs is always in existence as a positive potential, the threshold of the NMOS transistor 24 is in a lowered state all the time. As a result, the output signal OUT is output at higher speed than in the conventional circuit construction. In FIG. 3, waveforms illustrated by solid lines are those of the first embodiment of the present invention shown in FIG. 2, and waveforms illustrated by dotted lines are those of the related-art construction shown in FIG. 1.

Figure 4:
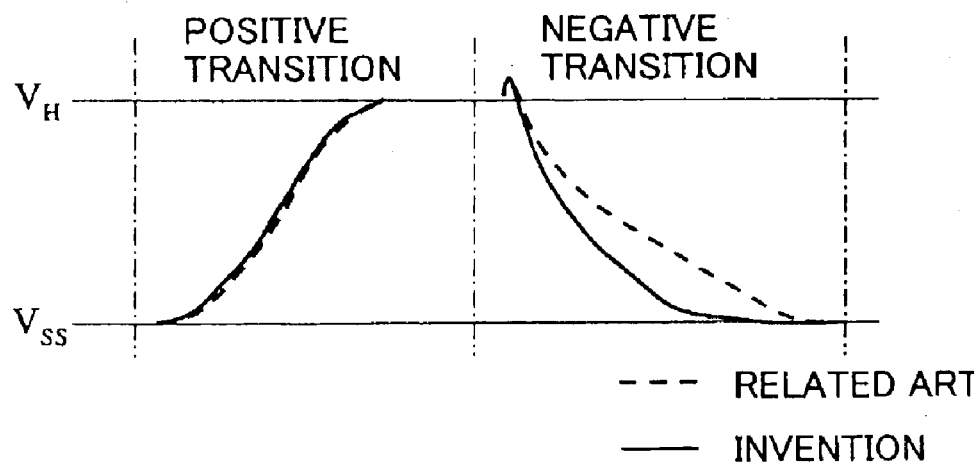
FIG. 4 is a chart showing an output signal waveform of the level-shifter circuit according to the first embodiment.

FIG. 4 is a chart showing an output signal waveform of the level-shifter circuit 20 according to the first embodiment. As shown in FIG. 4, the output signal waveform of the present invention illustrated by solid lines exhibits faster signal transition than a related-art output signal waveform shown by dotted lines. Here, the waveform of the substrate-bias potential Vbs shown in FIG. 3 and the output signal waveform of FIG. 4 are simulated waveforms obtained by a circuit simulator. Waveforms that will be shown hereafter are also obtained by use of the circuit simulator.

Figure 5:
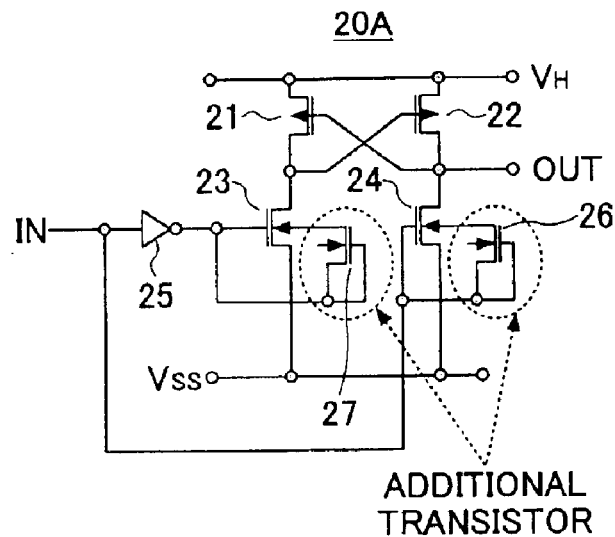
FIG. 5 is a circuit diagram showing a second embodiment of the level-shifter circuit of the present invention.

FIG. 5 is a circuit diagram showing a second embodiment of the level-shifter circuit of the present invention. In FIG. 5, the same elements as those of FIG. 2 are referred to by the same numerals, and a description thereof will be omitted unless it is necessary.

A level-shifter circuit 20A of FIG. 5 includes a NMOS transistor 27 newly provided in addition to the construction of the first embodiment shown in FIG. 2. The NMOS transistor 27 has a first node thereof coupled to the well of the NMOS transistor 23, and has a second node thereof and a gate node thereof commonly coupled to an inverse of the incoming signal IN that is output from the inverter 25.

In the first embodiment shown in FIG. 2, the threshold of the NMOS transistor 24 that pulls down the output signal OUT is lowered, thereby making faster the negative transition of the output signal OUT. In addition, the second embodiment shown in FIG. 5 is further provided with a function to lower the threshold of the NMOS transistor 23, which drives the PMOS transistor 22 that pulls up the output signal OUT. This makes it possible to achieve faster signal transition not only for the negative transition of the output signal OUT but also for the positive transition of the output signal OUT.

Figure 6:
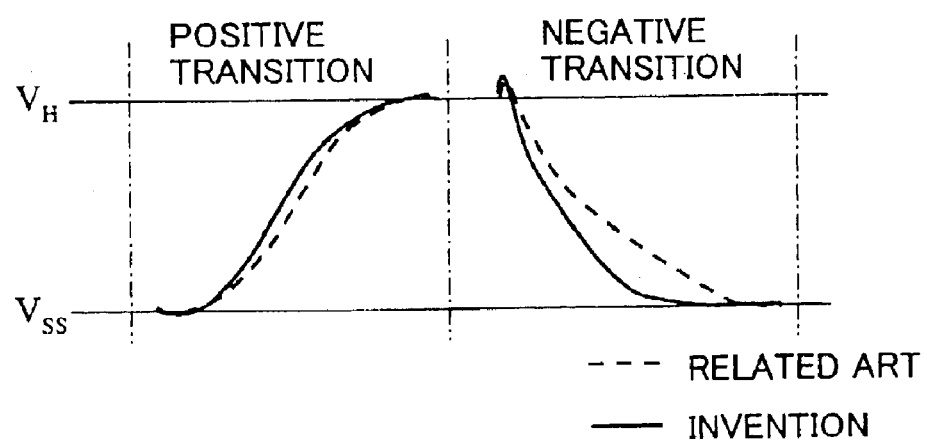
FIG. 6 is a chart showing an output signal waveform of the level-shifter circuit of the second embodiment.

FIG. 6 is a chart showing an output signal waveform of the level-shifter circuit 20A of the second embodiment. As shown in FIG. 6, an output signal waveform of the present invention illustrated by solid lines exhibits faster signal transition, with respect to both positive signal transition and negative signal transition, than a related-art output signal waveform shown by dotted lines.

Figure 7:
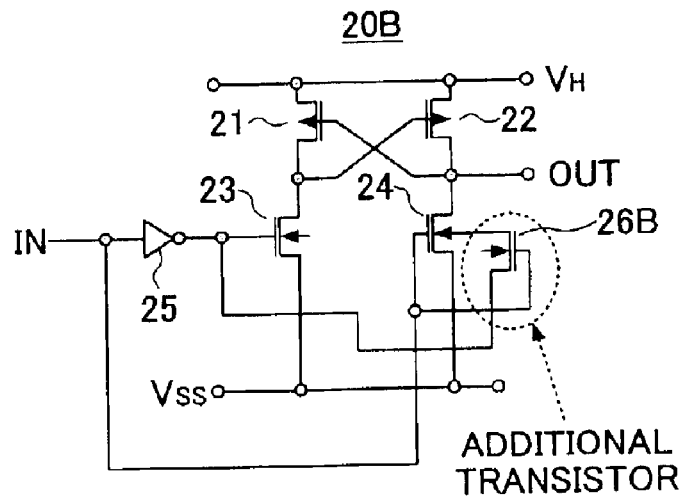
FIG. 7 is a circuit diagram showing a third embodiment of the level-shifter circuit of the present invention.

FIG. 7 is a circuit diagram showing a third embodiment of the level-shifter circuit of the present invention. In FIG. 7, the same elements as those of FIG. 2 are referred to by the same numerals, and a description thereof will be omitted unless it is necessary.

A level-shifter circuit 20B of FIG. 7 includes a NMOS transistor 26B that replaces the NMOS transistor 26 of the first embodiment shown in FIG. 2. The second node of the NMOS transistor 26B has a different coupling than that of the NMOS transistor 26. In the third embodiment, the second node of the NMOS transistor 26B is coupled to the output of the inverter 25.

The output of the inverter 25 changes from HIGH to LOW with a predetermined time delay after the transition from LOW to HIGH of the incoming signal IN. When the gate node of the NMOS transistor 26B is raised to HIGH by the incoming signal IN, therefore, the second node of the NMOS transistor 26B still remains at the HIGH level. Because of this, lowering of the threshold occurs only for the duration of the delay time of the inverter 25, thereby achieving high-speed switching. The output of the inverter 25 subsequently becomes LOW, so that the well of the NMOS transistor 24 coupled to the first node of the NMOS transistor 26B is pulled down to the LOW level. In this manner, the threshold is set in the zero-biased state while the NMOS transistor 24 is conductive. This prevents the flowing of an excessive through current.

Figure 8:
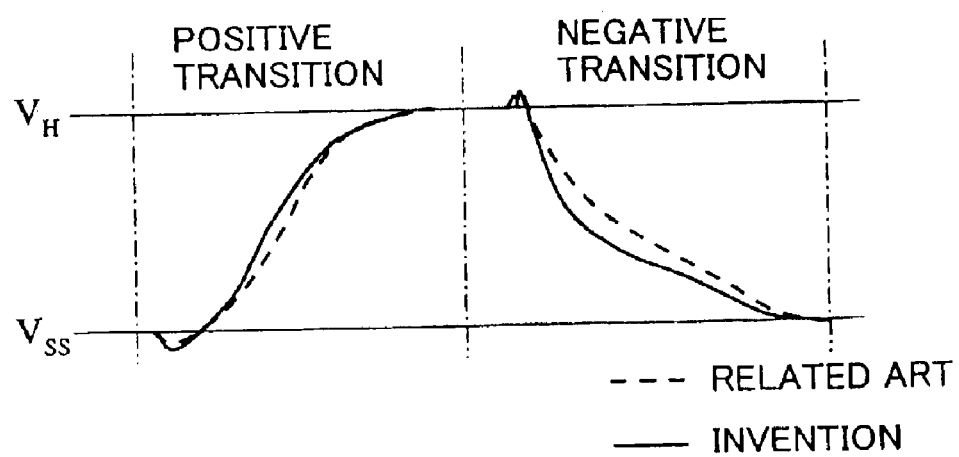
FIG. 8 is a chart showing an output signal waveform of the level-shifter circuit of the third embodiment.

FIG. 8 is a chart showing an output signal waveform of the level-shifter circuit 20B of the third embodiment. As shown in FIG. 8, an output signal waveform of the present invention illustrated by solid lines exhibits a faster change at the negative signal transition than a related-art output signal waveform shown by dotted lines. As described above, the threshold is set in the zero-bias state during the LOW period of the output signal. This makes it possible to switch off the NMOS transistor 24 at high speed at the positive signal transition, thereby further enhancing the speed of positive signal transition compared with the first embodiment.

Figure 9:
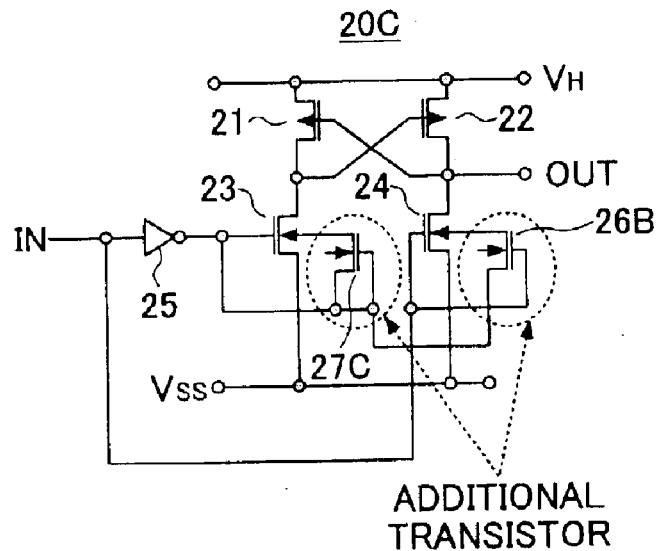
FIG. 9 is a circuit diagram showing a fourth embodiment of the level-shifter circuit of the present invention.

FIG. 9 is a circuit diagram showing a fourth embodiment of the level-shifter circuit of the present invention. In FIG. 9, the same elements as those of FIG. 7 are referred to by the same numerals, and a description thereof will be omitted unless it is necessary.

A level-shifter circuit 20C of FIG. 9 includes a NMOS transistor 27C newly provided in addition to the construction of the third embodiment shown in FIG. 7. The NMOS transistor 27C has a first node thereof coupled to the well of the NMOS transistor 23, and has a second node thereof and a gate node thereof commonly coupled to an inverse of the incoming signal IN that is output from the inverter 25.

In the third embodiment shown in FIG. 7, the threshold of the NMOS transistor 24 that pulls down the output signal OUT is lowered, thereby making faster the negative transition of the output signal OUT. In addition, the fourth embodiment shown in FIG. 9 is further provided with a function to lower the threshold of the NMOS transistor 23, which drives the PMOS transistor 22 that pulls up the output signal OUT. This makes it possible to achieve faster signal transition not only for the negative transition of the output signal OUT but also for the positive transition of the output signal OUT.

Figure 10:
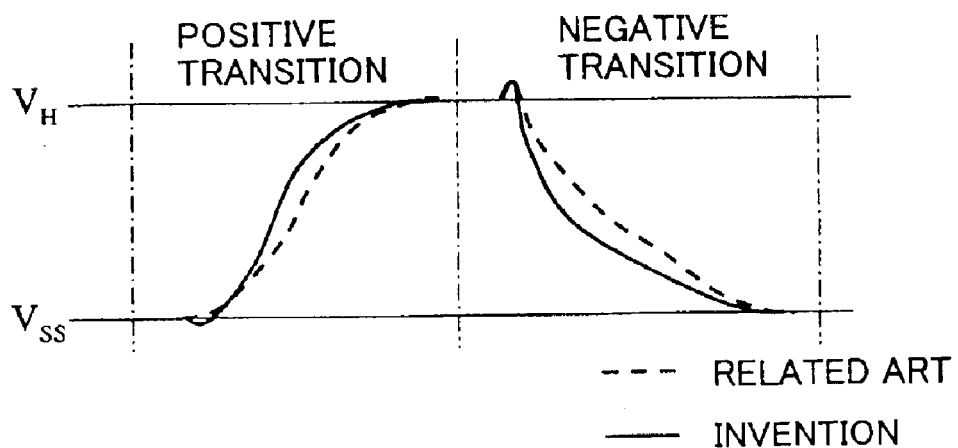
FIG. 10 is a chart showing an output signal waveform of the level-shifter circuit of the fourth embodiment.

FIG. 10 is a chart showing an output signal waveform of the level-shifter circuit 20C of the fourth embodiment. As shown in FIG. 10, an output signal waveform of the present invention illustrated by solid lines exhibits faster signal transition, with respect to both positive signal transition and negative signal transition, than a related-art output signal waveform shown by dotted lines.

Figure 11:
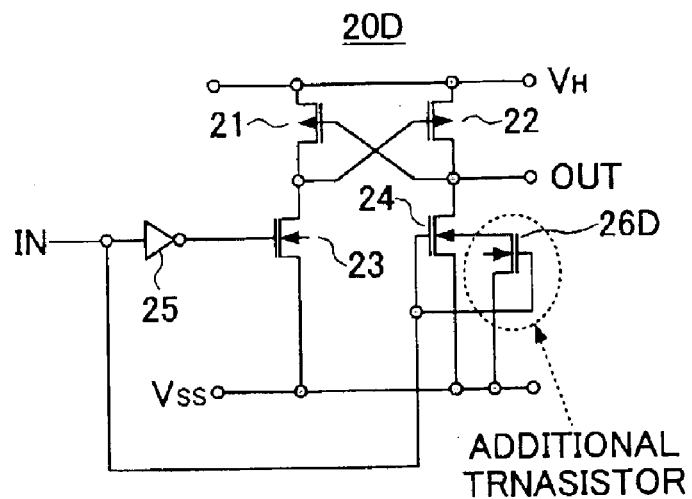
FIG. 11 is a circuit diagram showing a fifth embodiment of the level-shifter circuit of the present invention.

FIG. 11 is a circuit diagram showing a fifth embodiment of the level-shifter circuit of the present invention. In FIG. 11, the same elements as those of FIG. 2 are referred to by the same numerals, and a description thereof will be omitted unless it is necessary.

A level-shifter circuit 20D of FIG. 11 includes a NMOS transistor 26D that replaces the NMOS transistor 26 of the first embodiment shown in FIG. 2. The second node of the NMOS transistor 26D has a different coupling than that of the NMOS transistor 26. In the fifth embodiment, the second node (i.e., source node) of the NMOS transistor 26D is coupled to the ground potential Vss.

When the output signal OUT is about to rise in response to the change from HIGH to LOW of the incoming signal, i.e., when the NMOS transistor 24 is about to become nonconductive, the NMOS transistor 26D coupled to the well commences its switching-off operation. As a result, positive charge (i.e., positive holes) is accumulated in the well of the NMOS transistor 24, which leads to an increase in the well potential (i.e., the substrate-bias potential Vbs). When the NMOS transistor 26D is fully nonconductive, the substrate-bias potential Vbs of the NMOS transistor 24 is thus at a raised level. The threshold is thus at a lowered level.

Thereafter, the incoming signal changes from LOW to HIGH, resulting in the output signal OUT being pulled down. In this case, the output signal exhibits a faster change than in the related-art construction because the threshold of the NMOS transistor 24 has been held at the lowered level up to this point. When the NMOS transistor 26D subsequently becomes conductive, the drain potential drops to the source potential coupled to the ground potential. This brings the threshold of the NMOS transistor 24 down to the zero-bias level, thereby preventing the occurrence of an excessive through current.

Figure 12:
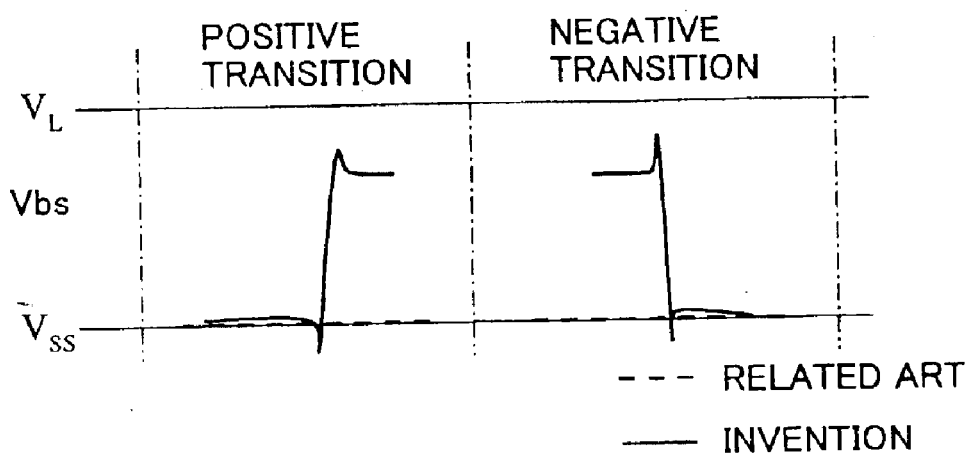
FIG. 12 is a chart showing an example of a substrate-bias potential Vbs according to the fifth embodiment.

FIG. 12 is a chart showing an example of a substrate-bias potential Vbs according to the fifth embodiment. At the positive transition of the output signal OUT, the substrate-bias potential Vbs is initially set to zero since the NMOS transistor 26D has been conductive up to this point. In this case, therefore, the threshold is relatively high, so that the NMOS transistor 24 will be switched off at high speed in response to the change from HIGH to LOW of the incoming signal IN. At the negative transition of the output signal OUT, the substrate-bias potential Vbs has been held at an elevated level because of the nonconductive state of the NMOS transistor 26D. In this case, thus, the threshold is relatively low, so that the NMOS transistor 24 will be switched on at high speed in response to the change from LOW to HIGH of the incoming signal.

Figure 13:
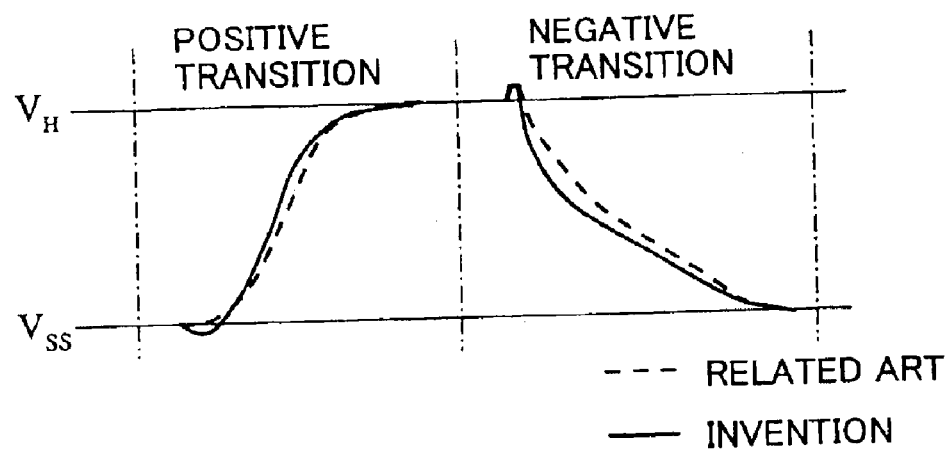
FIG. 13 is a chart showing an output signal waveform of the level-shifter circuit of the fifth embodiment.

FIG. 13 is a chart showing an output signal waveform of the level-shifter circuit 20D of the fifth embodiment. As shown in FIG. 13, an output signal waveform of the present invention illustrated by solid lines exhibits faster signal transition, with respect to both positive signal transition and negative signal transition, than a related-art output signal waveform shown by dotted lines.

Figure 14:
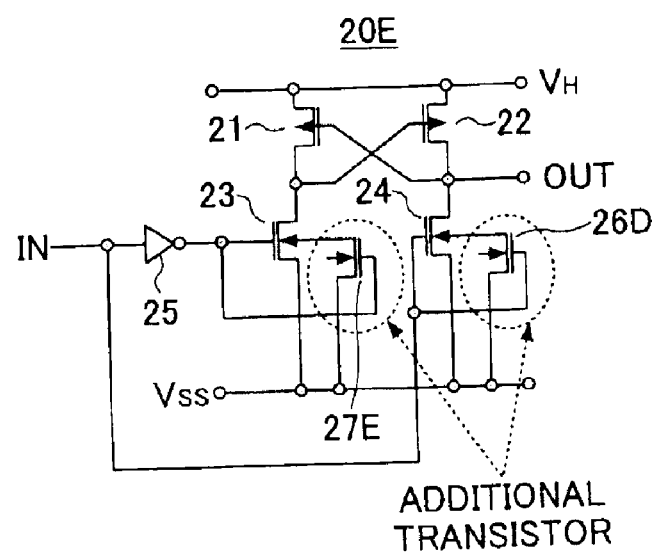
FIG. 14 is a circuit diagram showing a sixth embodiment of the level-shifter circuit of the present invention.

FIG. 14 is a circuit diagram showing a sixth embodiment of the level-shifter circuit of the present invention. In FIG. 14, the same elements as those of FIG. 11 are referred to by the same numerals, and a description thereof will be omitted unless it is necessary.

A level-shifter circuit 20E of FIG. 14 includes a NMOS transistor 27E newly provided in addition to the construction of the fifth embodiment shown in FIG. 11. The NMOS transistor 27E has a drain node thereof coupled to the well of the NMOS transistor 23, and has a source node thereof coupled to the ground potential, with a gate node thereof coupled to an inverse of the incoming signal IN that is output from the inverter 25.

In the fifth embodiment shown in FIG. 11, the threshold of the NMOS transistor 24 that pulls down the output signal OUT is lowered, thereby making faster the negative transition of the output signal OUT. In addition, the sixth embodiment shown in FIG. 14 is further provided with a function to lower the threshold of the NMOS transistor 23, which drives the PMOS transistor 22 that pulls up the output signal OUT. This makes it possible to achieve faster signal transition not only for the negative transition of the output signal OUT but also for the positive transition of the output signal OUT.

Figure 15:
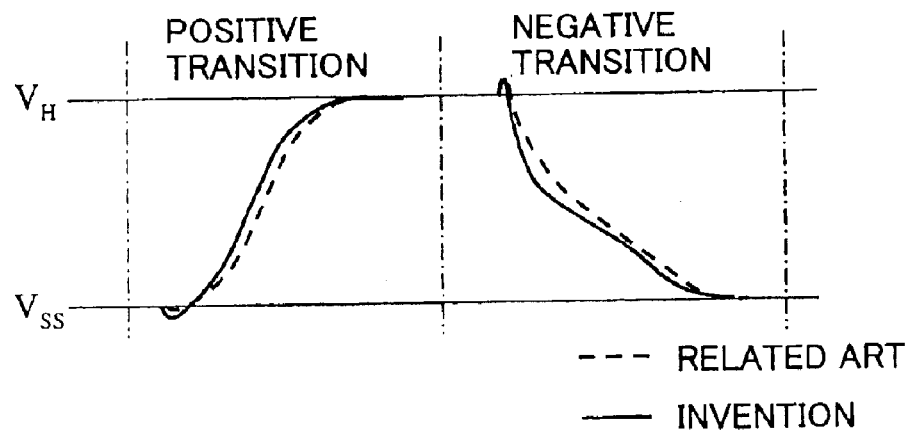
FIG. 15 is a chart showing an output signal waveform of the level-shifter circuit of the sixth embodiment.

FIG. 15 is a chart showing an output signal waveform of the level-shifter circuit 20E of the sixth embodiment. As shown in FIG. 15, an output signal waveform of the present invention illustrated by solid lines exhibits faster signal transition, with respect to both positive signal transition and negative signal transition, than a related-art output signal waveform shown by dotted lines.

Figure 16:
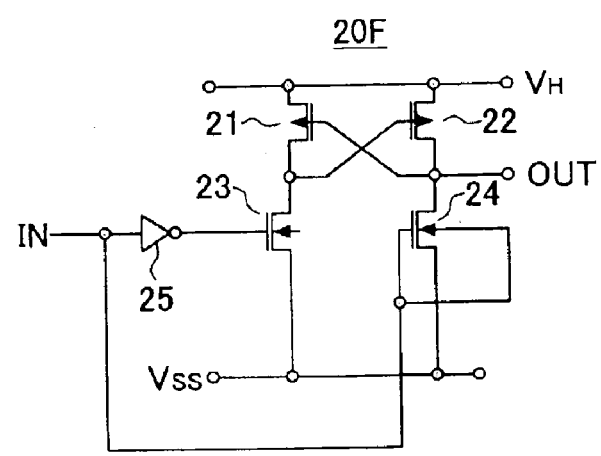
FIG. 16 is a circuit diagram showing a seventh embodiment of the level-shifter circuit of the present invention.

FIG. 16 is a circuit diagram showing a seventh embodiment of the level-shifter circuit of the present invention. In FIG. 16, the same elements as those of FIG. 2 are referred to by the same numerals.

In a level-shifter circuit 20F of FIG. 16, the well of the NMOS transistor 24 is directly coupled to the incoming signal IN. Such a direct coupling of the substrate to the incoming signal potential may destroy the NMOS transistor 24, and, thus, careful circuit design is required. If the potential $V_L$ of the incoming signal IN is sufficiently lowered through scaling, direct coupling may be used to boost the substrate bias by coupling the well of the NMOS transistor 24 to the incoming signal IN as shown in FIG. 16. This achieves high-speed signal transition of the output signal by lowering the threshold of the NMOS transistor 24 at the time of switching-on.

Figure 17:
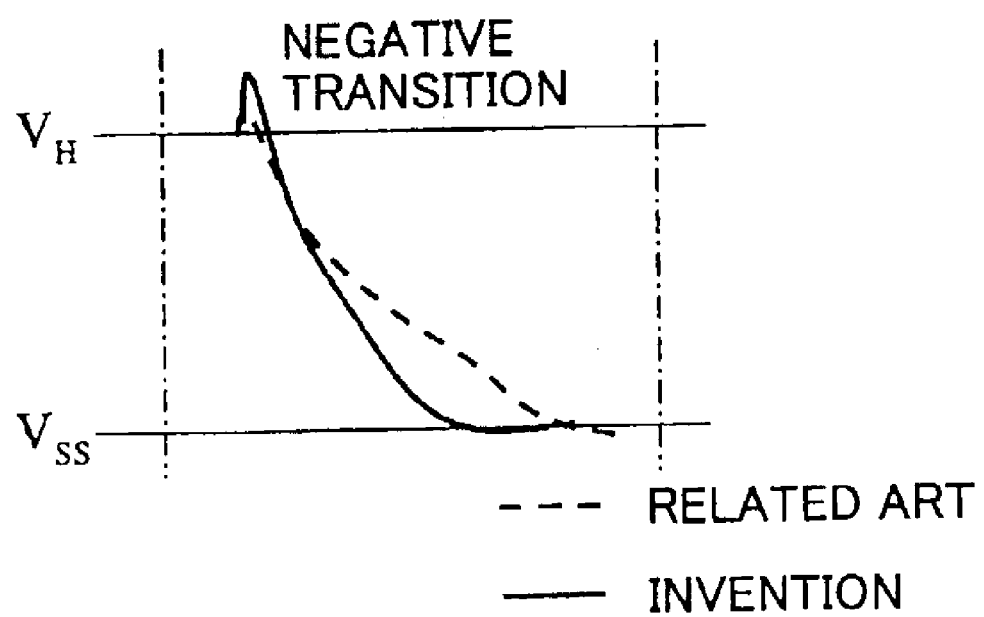
FIG. 17 is a chart showing an output signal waveform of the level-shifter circuit of the seventh embodiment.

FIG. 17 is a chart showing an output signal waveform of the level-shifter circuit 20E of the seventh embodiment. As shown in FIG. 17, an output signal waveform of the present invention illustrated by solid lines exhibits a faster change in the negative signal transition than a related-art output signal waveform shown by dotted lines.

Further, the present invention is not limited to these embodiments, but various variations and modifications may be made without departing from the scope of the present invention.

What is claimed is:

1. A semiconductor integrated circuit, comprising:
    first and second field-effect transistors which have on/off states thereof being controlled by an incoming signal varying within a first potential range;
    third and fourth field-effect transistors which are controlled by the on/off states of the first and second field-effect transistors;
    a node which is a drain of the first field-effect transistor and at which an output signal varying within a second potential range wider than the first potential range is obtained; and
    a control circuit which controls a substrate-bias potential of the first field-effect transistor in response to the incoming signal,
    wherein gate nodes of the first and second field-effect transistors are not directly connected to gate nodes of the third and fourth field-effect transistors, and
    wherein said control circuit is an NMOS transistor that has a first node thereof coupled to the substrate-bias potential of the first field-effect transistor, and has a second node and a gate node thereof coupled to the incoming signal.

2. The semiconductor integrated circuit as claimed in claim 1, further comprising an NMOS transistor that has a first node thereof coupled to a substrate-bias potential of the second field-effect transistor, and has a second node and a gate node thereof coupled to an inverse of the incoming signal.

3. The semiconductor integrated circuit as claimed in claim 1, wherein the first and second field-effect transistors are NMOS transistors, and the third and fourth field-effect transistors are PMOS transistors.

4. The semiconductor integrated circuit as claimed in claim 1, further comprising an inverter which generates an inverse of the incoming signal, wherein the first field-effect transistor is a first NMOS transistor having a gate thereof coupled to the incoming signal and a source thereof coupled to a ground, the second field-effect transistors being a second NMOS transistor having a gate thereof coupled to the output of said inverter and a source thereof coupled to the ground, the third field-effect transistor being a first PMOS transistor having a drain thereof coupled to a drain of the first NMOS transistor, a gate thereof coupled to a drain of the second NMOS transistor, and a source thereof coupled to a power supply potential, and the fourth field-effect transistor being a second PMOS transistor having a drain thereof coupled to the drain of the second NMOS transistor, a gate thereof coupled to the drain of the first NMOS transistor, and a source thereof coupled to the power supply potential.

5. A semiconductor integrated circuit, comprising:
    first and second field-effect transistors which have on/off states thereof being controlled by an incoming signal varying within a first potential range;
    third and fourth field-effect transistors which are controlled by the on/off states of the first and second field-effect transistors;
    a node which is a drain of the first field-effect transistor and at which an output signal varying within a second potential range wider than the first potential range is obtained; and
    a control circuit which controls a substrate-bias potential of the first field-effect transistor in response to the incoming signal,
    wherein gate nodes of the first and second field-effect transistors are not directly connected to gate nodes of the third and fourth field-effect transistors, and
    wherein said control circuit is an NMOS transistor that has a first node thereof coupled to the substrate-bias potential of the first field-effect transistor, and has a second node thereof coupled to an inverse of the incoming signal, with a gate node thereof coupled to the incoming signal.

6. The semiconductor integrated circuit as claimed in claim 5, further comprising an NMOS transistor that has a first node thereof coupled to a substrate-bias potential of the second field-effect transistor, and has a second node and a gate node thereof coupled to an inverse of the incoming signal.

7. The semiconductor integrated circuit as claimed in claim 5, wherein the first and second field-effect transistors are NMOS transistors, and the third and fourth field-effect transistors are PMOS transistors.

8. The semiconductor integrated circuit as claimed in claim 5, further comprising an inverter which generates an inverse of the incoming signal, wherein the first field-effect transistor is a first NMOS transistor having a gate thereof coupled to the incoming signal and a source thereof coupled to a ground, the second field-effect transistors being a second NMOS transistor having a gate thereof coupled to the output of said inverter and a source thereof coupled to the ground, the third field-effect transistor being a first PMOS transistor having a drain thereof coupled to a drain of the first NMOS transistor, a gate thereof coupled to a drain of the second NMOS transistor, and a source thereof coupled to a power supply potential, and the fourth field-effect transistor being a second PMOS transistor having a drain thereof coupled to the drain of the second NMOS transistor, a gate thereof coupled to the drain of the first NMOS transistor, and a source thereof coupled to the power supply potential.

9. A semiconductor integrated circuit, comprising:
first and second field-effect transistors which have on/off states thereof being controlled by an incoming signal varying within a first potential range;
third and fourth field-effect transistors which are controlled by the on/off states of the first and second field-effect transistors;
a node which is a drain of the first field-effect transistor and at which an output signal varying within a second potential range wider than the first potential range is obtained; and
a control circuit which controls a substrate-bias potential of the first field-effect transistor in response to the incoming signal,
wherein gate nodes of the first and second field-effect transistors are not directly connected to gate nodes of the third and fourth field-effect transistors, and
wherein said control circuit is a signal line that provides a direct coupling between the substrate-bias potential of the first field-effect transistor and the incoming signal.

10. A semiconductor integrated circuit, comprising:
first and second field-effect transistors which have on/off states thereof being controlled by an incoming signal varying within a first potential range;
third and fourth field-effect transistors which are controlled by the on/off states of the first and second field-effect transistors;
a node from which an output signal varying within a second potential range is output according to the on/off states of the first through fourth field-effect transistors; and
a control circuit which controls a substrate-bias potential of the first field-effect transistor in response to the incoming signal,
wherein said control circuit is an NMOS transistor that has a first node thereof coupled to the substrate-bias potential of the first field-effect transistor, and has a second node and a gate node thereof coupled to the incoming signal.

11. The semiconductor integrated circuit as claimed in claim 10, further comprising an NMOS transistor that has a first node thereof coupled to a substrate-bias potential of the second field-effect transistor, and has a second node and a gate node thereof coupled to an inverse of the incoming signal.

12. A semiconductor integrated circuit, comprising:
first and second field-effect transistors which have on/off states thereof being controlled by an incoming signal varying within a first potential range;
third and fourth field-effect transistors which are controlled by the on/off states of the first and second field-effect transistors;
a node from which an output signal varying within a second potential range is output according to the on/off states of the first through fourth field-effect transistors; and
a control circuit which controls a substrate-bias potential of the first field-effect transistor in response to the incoming signal,
wherein said control circuit is an NMOS transistor that has a first node thereof coupled to the substrate-bias potential of the first field-effect transistor, and has a second node thereof coupled to an inverse of the incoming signal, with a gate node thereof coupled to the incoming signal.

13. The semiconductor integrated circuit as claimed in claim 12, further comprising an NMOS transistor that has a first node thereof coupled to a substrate-bias potential of the second field-effect transistor, and has a second node and a gate node thereof coupled to an inverse of the incoming signal.

14. A semiconductor integrated circuit, comprising:
first and second field-effect transistors which have on/off states thereof being controlled by an incoming signal varying within a first potential range;
third and fourth field-effect transistors which are controlled by the on/off states of the first and second field-effect transistors;
a node from which an output signal varying within a second potential range is output according to the on/off states of the first through fourth field-effect transistors; and
a control circuit which controls a substrate-bias potential of the first field-effect transistor in response to the incoming signal,
wherein said control circuit is a signal line that provides a direct coupling between the substrate-bias potential of the first field-effect transistor and the incoming signal.

* * * * *